United States Patent [19]
Chrysler et al.

[11] Patent Number: 5,758,418
[45] Date of Patent: Jun. 2, 1998

[54] METHOD OF MAKING AN ULTRA HIGH-DENSITY, HIGH-PERFORMANCE HEAT SINK

[75] Inventors: Gregory Martin Chrysler; Richard Chao-Fan Chu, both of Poughkeepsie, N.Y.

[73] Assignee: International Business Machines Corporation, Armonk, N.Y.

[21] Appl. No.: 587,865

[22] Filed: Jan. 11, 1996

[51] Int. Cl.$^6$ .................................. B23P 15/00
[52] U.S. Cl. ..................... 29/890.03; 29/890.054
[58] Field of Search ............. 29/890.03, 890.054; 165/80.3

[56] References Cited

U.S. PATENT DOCUMENTS

| | | |
|---|---|---|
| 4,897,712 | 1/1990 | Prokopp . |
| 5,406,451 | 6/1993 | Korinsky . |
| 5,419,041 | 5/1995 | Ozeki ........................... 29/840.03 |
| 5,507,092 | 4/1996 | Akechi ........................... 165/80.3 |

OTHER PUBLICATIONS

Buller, et al., "Inexpensive Omnidirectional Heat Sink", IBM Technical Disclosure Bulletin, vol. 38, No. 5, May, 1995 (AT894–0749) pp. 81–82.

Cutt et al., "Clip–On Heat Sink for Memory Single In–Line Memory Module", IBM Technical Disclosure Bulletin, vol. 32, No. 9B, Feb. 1990 (BC888–0292), pp. 259–260.

*Primary Examiner*—Irene Cuda
*Attorney, Agent, or Firm*—Lawrence D. Cutter

[57] ABSTRACT

An efficient heat sink having a high density of fins and a large effective surface area is formed by coiling a flat strip of thermally conductive material in which teeth or millifins have been formed by a stamping operation, for example. A spacer may be employed to insure fin separation. In an alternate embodiment, the strips are stacked. The resulting heat sink is particularly effective in impingement flow cooling of electronic devices, chips, circuits or modules.

18 Claims, 4 Drawing Sheets

METHOD OF MAKING AN ULTRA HIGH-DENSITY, HIGH-PERFORMANCE HEAT SINK

BACKGROUND OF THE INVENTION

The present invention is generally directed to heat sink structures and to manufacturing processes for producing heat sinks having high-performance cooling capabilities. More particularly, the invention is directed to heat sinks having a large plurality of fin structures which exhibit a large surface area per unit volume. Even more particularly, the present invention is directed to high-performance millifin heat sinks having improved structural rigidity, excellent thermal transfer characteristics and ease of manufacture.

Since electronic circuit chips and other electronic circuit components are being designed with ever increasingly higher power ratings, the challenge of cooling these devices and systems becomes more difficult. The cooling challenge is seen to be directly related to the desire to have these circuit chip devices operate at increasingly higher frequencies. Accordingly, there is a growing desire and need to provide mechanisms and heat sink structures which are particularly effective and efficient for cooling these devices.

However, while it is known that it is desirable to increase cooling surface area, it is also known that there are penalties for employing structures with fins which have a high aspect ratio, that is, ratio of height to cross-sectional area. In particular, there is not only the problem of structural rigidity, but the actual manufacture of devices exhibiting very thin fins is also difficult. It is seen that heat sink devices with fins having a small cross-sectional area are subject to damage because of the fin length relative to its base area: the larger the fin height, the greater the problem; the smaller the base area, the greater the problem.

Furthermore, it is hard to manufacture heat sinks made from desirable thermally conductive materials which, nonetheless, exhibit long fin structures having a high surface area. Thus, while it is desirable to make heat sinks of materials such as copper and aluminum, the ability to produce heat sink structures of these materials is limited by the lack of manufacturing methods. The use of such materials in heat sinks exhibiting small length scales has proven to be difficult.

However, the desirability of increasing the surface area per volume is clearly seen by considering a heat sink having a regular array of in-line square "pin fins". To see this more easily, let us assume that the length of the heat sink base is L and that the height of each one of the fins is H. It is further assumed that there is a square pin fin at each corner of the heat sink and that there is a total of m spaces and fins along each edge. If this is the case, there are $(m+1)/2$ square pin fins along each edge of the square heat sink. It is noted that m is thus always odd (because there is a fin at each corner and because it takes two fins to define a space) and greater than 1. Thus, the regular array possesses $N^2$ fins where $N=(m+1)/2$. Assuming that each pin and inter-pin space is the same along each edge, each pin has a side of length $L/m$. Furthermore, it is readily seen that each of these square cross-section pins possesses a perimeter of length $4L/m$ and, thus, a total surface area of $4LH/m$. Therefore, the total surface area for all of the fins in the heat sink is $4N^2LH/m$, where $N=(m+1)/2$. For the case of $m=21$, that is, for the case in which the pin fins are arranged in an 11 by 11 array ($N=11$), one can compute the total pin surface area (excepting the top area of the pin); this number is referred to herein as $A_{21}$. In a similar manner, for the case in which $m=11$ (that is, $N=6$), the heat sink has an array of 6 rows of pin fins with 6 pins in each row. In this case, one computes the total pin area, referred to herein as $A_{11}$. For this particular configuration, the ratio $A_{21}/A_{11}$ turns out to be equal to 1.76. This means that by increasing the number of pins from a 36-pin array to an array having 121 fins, there is a 76 percent increase in fin area. This increase in surface area occurs without any corresponding increase in heat sink volume.

Thus, it is seen while it is very desirable to increase the pin fin area, it is still nonetheless seen that the large number of fins desired together with their small size in terms of cross-sectional area makes it very difficult to manufacture these devices in an efficient yet economical fashion. In particular, it is noted that with an increasing value m, the number and complexity of machining operations goes to a point where it is not practical to construct such devices. This is particularly true when one wishes to construct heat sinks out of highly thermally conductive material such as copper. Likewise, one cannot easily extrude such heat sinks since their structures are two dimensional or at least include two dimensional aspects which cannot be fabricated using extrusion methods. Similarly, methods of manufacturing such devices using casting techniques are not practical because of the high aspect ratio associated with each of the (pin) fins.

SUMMARY OF THE INVENTION

In accordance with a preferred embodiment of the present invention, a heat sink comprises a base strip of thermally conductive material which has a plurality of teeth or fin-like (surface area enhancing) projections extending from a long edge of the strip. A spacer strip is disposed adjacent to the base strip along the portion of the base strip from which the fins extend. The base strip and spacer strip are coiled together or arranged in a stack to form a high surface area heat sink. Means are provided for holding the structure in place.

In an alternate embodiment of the present invention, a second spacer strip may be disposed adjacent to the tips of the fins or teeth to provide additional structural strength so that the fins themselves may be made longer. Such a structure is particularly useful in systems in which the flow of air is crosswise.

Accordingly, it is an object of the present invention to provide an ultra high-efficiency thermal heat sink.

It is a further object of the present invention to provide a heat sink which is easily, effectively and economically manufacturable.

It is also an object of the present invention to provide a heat sink which is particularly useful in air impingement cooling systems.

It is yet another object of the present invention to provide an economical heat sink exhibiting millifin structures.

It is a still further object of the present invention to increase heat sink surface area in a given volume.

It is yet another object of the present invention to facilitate the utilization of highly thermally conductive materials such as copper in the manufacture of heat sinks.

It is also an object of the present invention to provide heat sinks which are particularly well suited for cooling electronic circuit chips, components and modules.

It is a still further object of the present invention to take advantage of both material properties and length scale considerations in the design and manufacture of high-performance cooling devices.

It is an even further object of the present invention to produce millifin heat sink structures exhibiting sufficient structural strength and rigidity.

Lastly, but not limited hereto, it is an object of the present invention to increase the thermal performance of heat sinks and to thereby more effectively cool electronic circuit components, particularly those operating at higher frequencies which are needed and/or desired by processing speed requirements.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
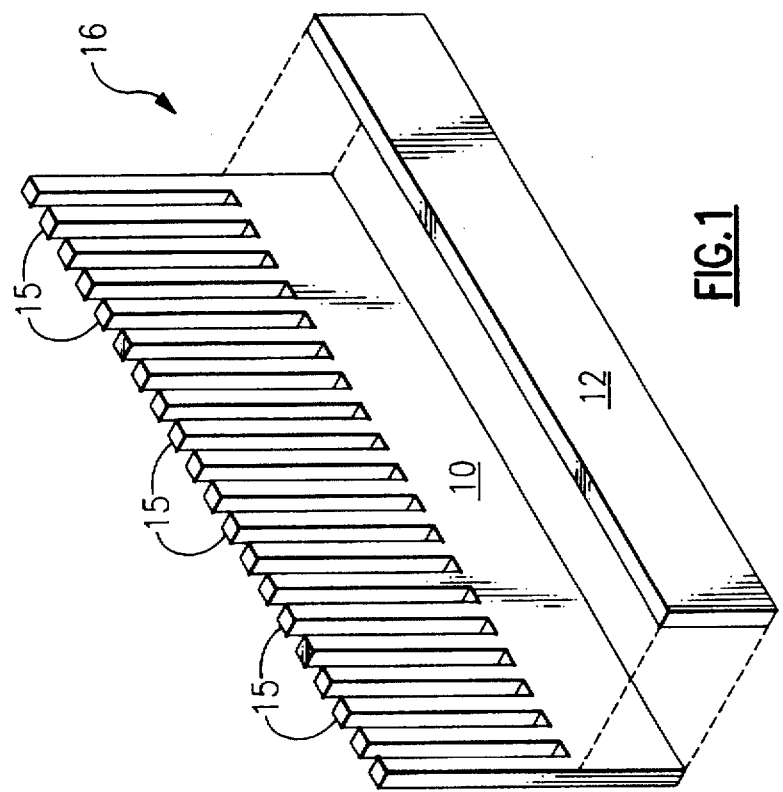
FIG. 1 is an isometric view illustrating the structure and assembly of the basic element from which a high-performance heat sink is constructed.

In accordance with one embodiment of the present invention, a heat sink is formed from the structural subunit shown in FIG. 1. In particular, the basic building block for a heat sink is a foil of thermally conductive material such as copper or aluminum. For purposes of the present invention, copper is a preferred material. For example, a strip of copper foil with a width equal to the total height of the heat sink is used as the starting point for a manufacturing process which produces the heat sink. The thickness of the foil determines the thickness of the individual millifins. A stamping process is preferably employed to remove material at regular intervals from along the strip of copper foil; however, other methods, such as cutting, may also be employed. The resulting structure provides base strip 10 from which millifin structures 15 extend. The depth of the cut made in the original foil material determines the length of the resulting fins. As shown in FIG. 1, the fins and the removed material have the same width. However, this is not a requirement of the present invention; any combination of fin width and fin separation may be employed.

Furthermore, since stamping is a generally preferred method of manufacture, especially in terms of its cost effectiveness, it should be noted that the shape of the fins is not restricted to being rectangular. It is possible, therefore, to employ fins having a triangular or trapezoidal face. It is also possible to easily provide short links between select adjacent fins when stamping is employed. These links provide extra rigidity to the structure, especially in the coiled construction form and thereby permit longer fins with a concomitantly higher surface area to be employed.

Also, in accordance with a preferred embodiment of the present invention, a screening of solder is placed along base portion 10 of the copper strip. The placement of the solder screening may be done either before, during or after the stamping of the fins. However, more particularly shown in FIG. 1 is the inclusion of spacer strip 12. Spacer strip 12 could be, but is not required to be, of the same thickness as the foil strip from which base strip 10 and teeth 15 are produced. Furthermore, while it is not necessary that spacer strip 12 even comprise the same thermally conductive material as base strip 10, it is preferable that it does, in fact, constitute the same material, and it is preferable that this material is copper. It is, nonetheless, a requirement that spacer strip 12 be solderable to base strip 10 in those embodiments of the present invention in which a solder bond is employed to create a completed, rigid structure.

In these embodiments of the present invention in which aluminum is used as a heat sink material, soldering is not a desirable method of bonding either the stacked configuration or the coiled configuration. However, in situations where aluminum is a desired material, it is possible to employ a brazing compound disposed in a sheet or as a grease between the layers which are to be bonded, as for example, in an oven. Once solidified, the aluminum brazing material creates a permanent structure (coiled or stacked). In the case of a coiled structure, it may also be trimmed to create a square or rectangular heat sink.

Figure 2:
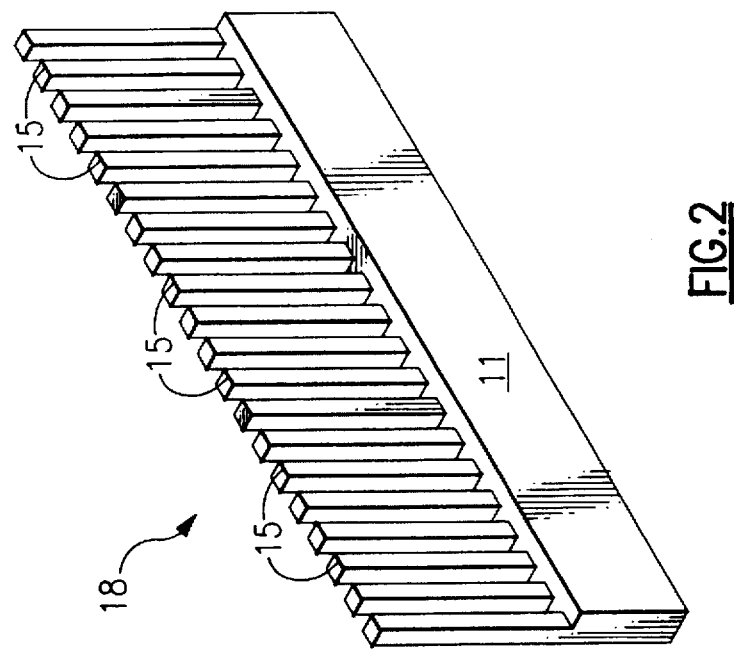
FIG. 2 is a view similar to FIG. 1 but more particularly illustrating utilization of a monolithic structure to accomplish the same purpose.

While the structure shown in FIG. 1 illustrates a preferred embodiment of the present invention in terms of ease of manufacture based upon building block 16, it is also possible to employ, as a basis for the heat sink, the structure illustrated in FIG. 2. In this figure, it is seen that building block 18 for the heat sink is made from a strip of multi-gauge material. In particular, in structure 18 in FIG. 2, base strip 10 and spacer strip 12 comprise a single monolithic structure. Nonetheless, the geometry of the resulting structure is the same as that shown in FIG. 1. Additionally, structures 16 and 18 comprise a sufficiently thin layer of material so that it may be rolled around a cylindrical mandrel or form. The structure in FIG. 2 is preferably formed in a two-step process in which the upper portion of a copper strip is skived half way through. However, it is noted that more or less than 50 percent of the material may be removed (say 40 percent, 60 percent, 70 percent, etc.). At this point, the material between pins 15 is removed, preferably by a stamping operation. Again, starting structure 18 that results is geometrically the same as starting structure 16 shown in FIG. 1.

Figure 5:
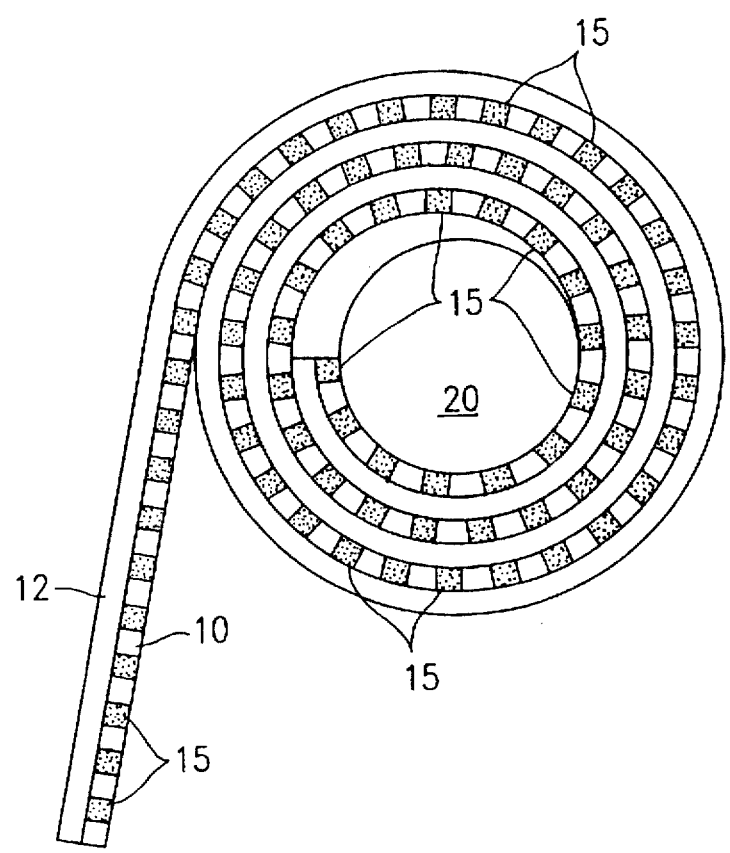
FIG. 5 is a top view of a coiled heat sink structure in the process of being assembled from the structural unit shown in FIG. 1.

One method of manufacturing an ultra high-density heat sink from subunits 16 or 18 illustrated in FIGS. 1 and 2 is to create a roll. After the fins are stamped and the solder screened onto the base (front sides of strips 11 and 12 and/or back side of base strip 10), the fin stock is rolled around cylindrical plug 20 (also preferably comprising copper). With each wrap around plug 20, another layer of fins is created as shown in FIG. 5. Plug 20 serves as a starting diameter for wrapping layer upon layer of fin stock, as well as for providing a central recess area for jet impingement cooling. Clearly, jet impingement cooling represents one area of application in which the present invention may be employed. Once the wrapping of structures 16 or 18 is completed, the assembly is oven reflow soldered to create a single part. The result is a heat sink having a circle base. This heat sink may be trimmed to create a square or rectangular shaped heat sink if so desired.

Figure 3:
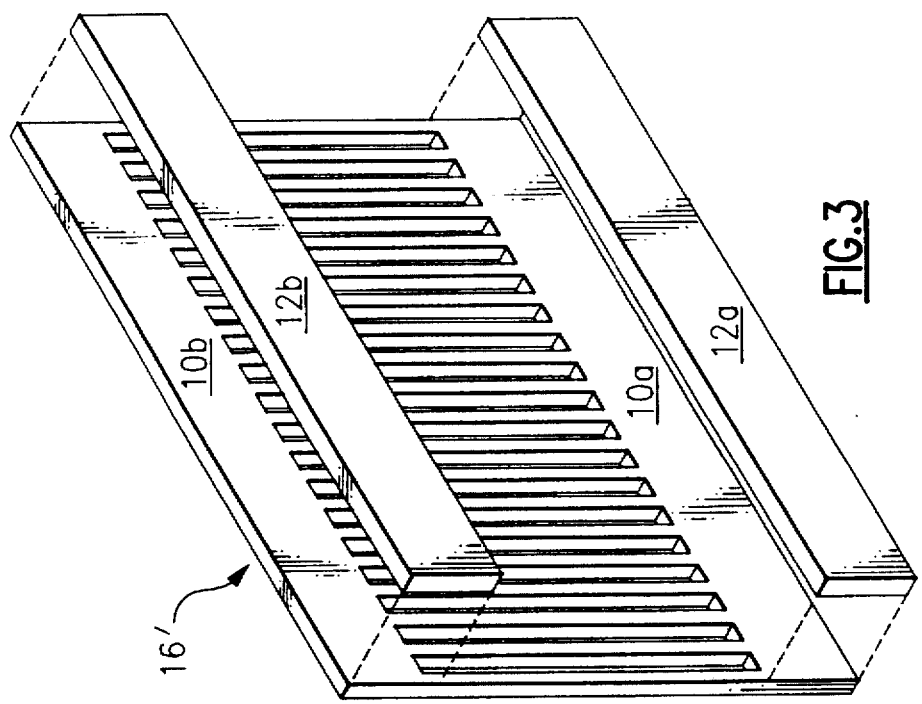
FIG. 3 is an isometric view of a structure similar to that shown in FIG. 1 but more particularly illustrating the possibility of employing a second spacer strip for one of several purposes: structural rigidity and/or the manufacture of two devices simultaneously.
Figure 6:
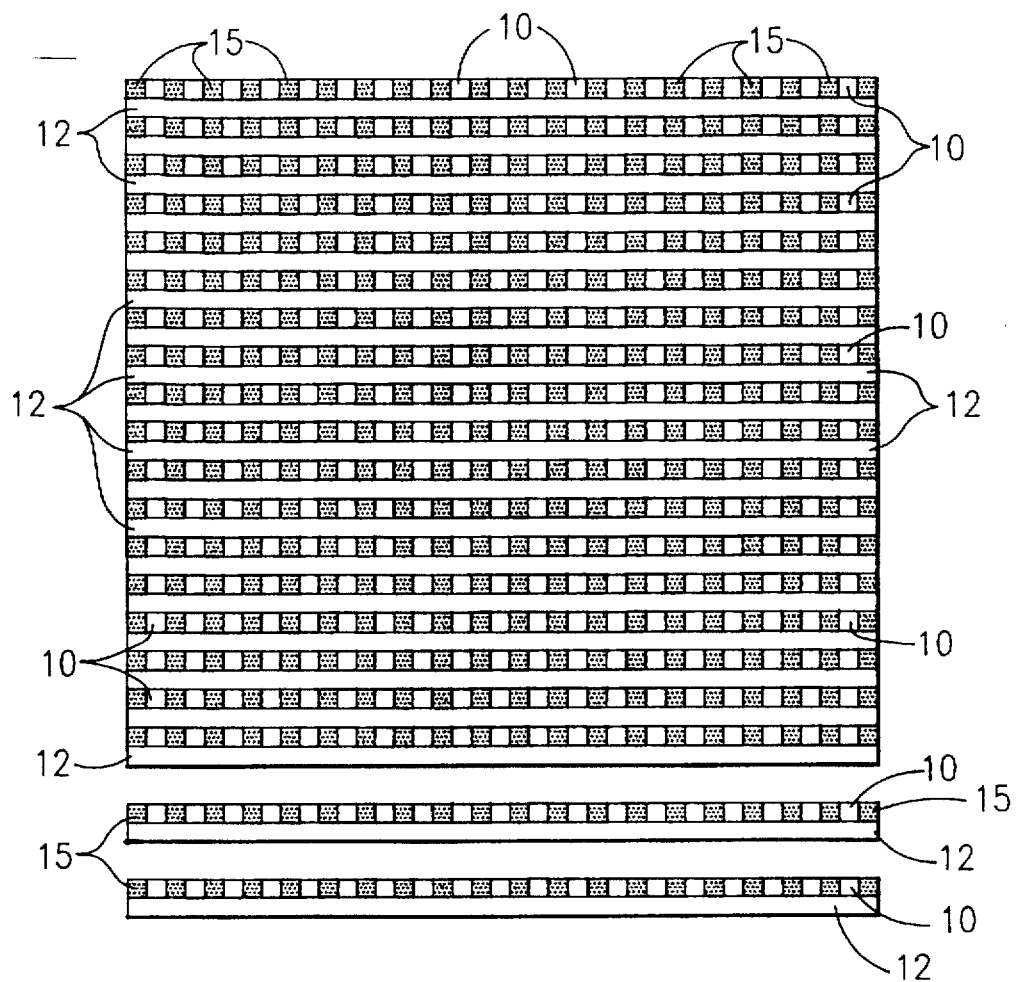
FIG. 6 is a top view of a heat sink structure assembled in accordance with the present invention from the structural subunits shown in FIG. 1 and more particularly showing a stacked arrangement thereof.

A second method of manufacturing the high-performance heat sink is to take the continuous finned stock foil shown in FIG. 1 and to cut to size and stack it front to back as shown in FIG. 3. With solder screening in place on the strip surfaces to be joined, the stacked work piece may be placed in an oven or otherwise heated to a point sufficient to melt the solder after which the unit is allowed to cool so as to produce an integrated structure. If the continuous fin stock foil is, in fact, folded front to back, it is preferable that sacrificial material along the folds be removed so as to create the same structure that would exist if individual lengths of continuously finned strips, as shown in FIG. 1, had been stacked. Thus, in accordance with methods for manufacturing the present invention, FIG. 6 illustrates the net result of stacking individual strips or folding a continuous strip and removing excess material. In either case, a square or rectangular heat sink is formed. In either case, a top view of the resultant heat sink is illustrated in FIG. 6.

In certain embodiments of the present invention, the presence of a spacer strip is not necessary. In particular, by choosing the positions for teeth or fins 15 along base strip 10, it is possible to assure that, once rolled into a coiled configuration, the fins do not overlap one another. The same is true for the stacked arrangement of FIG. 3. In particular, by doubling the space between fins and by arranging them in a staggered configuration, it is possible to produce heat sinks with any desired arrangement of air flow passages in directions transverse to the fins.

Figure 4:
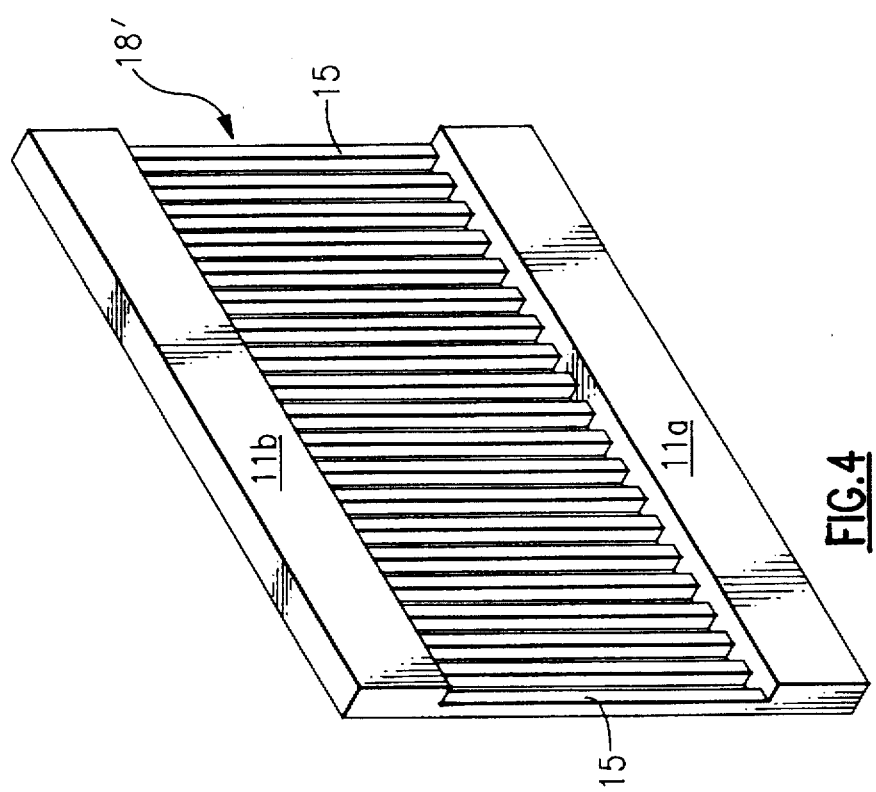
FIG. 4 is an isometric view similar to FIG. 3 but more particularly illustrating the utilization of a monolithic structure.

It should also be noted that a heat sink may be manufactured in accordance with the present invention by employing the foil stock shown in FIGS. 3 or 4. These figures illustrate two aspects of the present invention. In particular, it is noted that dual spacer strips 11a or 11b or spacer portions 12a and 12b, as shown, are employed for one of two purposes. In a first aspect, these upper spacer strips or portions are included to provide extra structural rigidity either for manufacture or even possibly afterward. In such instances, an upper strip portion (for example) is preferably smaller than the other spacer strip or portion. However, it is noted that in such instances after manufacture the upper portion of the heat sink would be covered and, accordingly, would have significantly less value in an impingement cooling situation. However, the resulting heat sink would, nonetheless, be of value in a cross-flow cooling system.

Additionally, it is also noted that the base foil stock structure shown in FIGS. 3 and 4 may be employed to construct two heat sinks at the same time. In particular, a cut perpendicular to teeth 15 may be employed either before or after the base foil stock shown is either stacked or rolled into a coil or folded and trimmed as described above. Also as above, it is noted that the spacing between fins 15 may be controlled so that when wrapped, folded, coiled or stacked, a spacer strip or portion is not required.

In certain embodiments of the present invention, the space between consecutive layers in a coil or stack configuration can be controlled by using an appropriately sized spacer (See FIG. 1) or by proper specification of a dual gauge foil stock (See FIG. 2). Although a spacer is not required under all conditions, it does ensure that there is always a pathway for coolant flow. One condition for which a spacer would not be required is the case where the width of the material stamped is much larger than the material left for the fins. Then, as long as consecutive layers are not arranged with the fins actually touching each other, there is no possibility of a blocked flow, as described above.

Additionally, it is noted that customized flow paths can easily be created by properly varying the spaces between fins 15 during the stamping process. In the wrapped case, a series of spiral or direct flow paths leading from the central plug to the edge of the heat sink can be created.

A particular advantage of the use of copper foil is that of characteristic length. The foil thickness can be chosen to be relatively thick, resulting in what would appear to be a more conventional heat sink. Conversely, a very thin foil could be used, thus producing a heat sink with a brush-like fin structure. Copper allows taller fins for a given fin cross section and, thus, more heat transfer area than an aluminum heat sink. However, the heat sink and manufacturing techniques presented herein are equally applicable to aluminum and other metals as well as to thermally conductive plastics. However, in the case of thermally conductive plastics, the assembly process is modified to one employing adhesives for plastic rather than solder.

From the above, it should be appreciated that the method of manufacture disclosed herein produces an ultra high-density, high-performance heat sink device. Furthermore, it is seen that the present invention takes full advantage of the material and aspect ratios to produce a high-efficiency device which is easy to manufacture, reliable and concomitantly economically to manufacture, customize and employ. It is further seen that the description above provides detailed information enabling those skilled in the art area to employ methods and apparatus to produce devices satisfying all of the objects listed above.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for manufacturing a heat sink, said method comprising the steps of:

removing material from along a long edge of a base strip of thermally conductive material so as to form a comb-like structure with teeth extending outwardly from said strip;

affixing a spacer strip along at least a portion of said base strip from which material is not removed;

coiling said base and spacer strips into a spiral configuration; and providing means for said coiled structure to be permanent.

2. The method of claim 1 in which said material is selected from the group consisting of copper, aluminum and thermally conductive plastic.

3. The method of claim 1 in which said spacer is affixed with solder.

4. The method of claim 1 in which said coiling is done about a plug.

5. The method of claim 4 in which said plug comprises copper.

6. The method of claim 1 in which said material is metal and said providing step is carried out by soldering said spiral configuration.

7. The method of claim 6 further including the step of trimming said coiled structure to form a rectangular structure.

8. The method of claim 1 in which said material is aluminum and said providing step is carried out by brazing said spiral configuration.

9. The method of claim 8 further including the step of trimming said coiled structure to form a rectangular structure.

10. The method of claim 1 in which said material is thermally conductive plastic and in which said providing step is carried out by adhesively bonding said spiral configuration.

11. The method of claim 10 further including the step of trimming said coiled structure to form a rectangular structure.

12. The method of claim 1 in which said removing step is accomplished by stamping.

13. The method of claim 1 in which said removing step is accomplished by cutting.

14. A method for manufacturing a heat sink, said method comprising the steps of:

removing material from along a long edge of a base strip of thermally conductive material so as to form a comb-like structure with teeth extending outwardly from said strip;

affixing a spacer strip along at least a portion of said base strip from which material is not removed;

stacking together a plurality of base and spacer strips in a rectangular array; and providing a means for said stacked structure to be permanent.

15. The method of claim 14 in which said material is selected from the group consisting of copper, aluminum and thermally conductive plastic.

16. The method of claim 14 in which said spacer is affixed with solder.

17. The method of claim 14 in which said material is metal and said providing step is carried out by soldering said stacked structure.

18. The method of claim 14 in which said material is thermally conductive plastic and in which said providing step is carried out by adhesively bonding said stacked structure.

* * * * *